(12) United States Patent
Kim et al.

(10) Patent No.: US 7,202,501 B2
(45) Date of Patent: Apr. 10, 2007

(54) THIN FILM TRANSISTOR AND METHOD FOR FABRICATING THE SAME

(75) Inventors: Hoon Kim, Seoul (KR); Ki-Yong Lee, Yongin-si (KR); Jin-Wook Seo, Suwon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 259 days.

(21) Appl. No.: 10/989,642

(22) Filed: Nov. 17, 2004

(65) Prior Publication Data
US 2005/0110022 A1 May 26, 2005

(30) Foreign Application Priority Data
Nov. 22, 2003 (KR) ............... 10-2003-0083381

(51) Int. Cl.
*H01L 29/04* (2006.01)
*H01L 21/84* (2006.01)

(52) U.S. Cl. ............... 257/72; 257/191; 257/E21.703; 257/E29.137; 438/149; 438/150; 438/166; 438/482; 438/486

(58) Field of Classification Search ............ 257/72; 438/149
See application file for complete search history.

(56) References Cited

U.S. PATENT DOCUMENTS 6,566,179 B2 * 5/2003 Murley et al. ............... 438/166
7,026,193 B1 * 4/2006 Ohtani et al. ............... 438/149
2003/0030108 A1 * 2/2003 Morosawa ............... 257/359
2004/0110329 A1 * 6/2004 Joo et al. ............... 438/166
2006/0121655 A1 * 6/2006 Paik ............... 438/166

FOREIGN PATENT DOCUMENTS

| JP | 06-244205 A1 | 9/1994 |
| JP | 11-097710 A1 | 4/1999 |
| JP | 2002-208599 A1 | 7/2002 |
| JP | 2002-299348 A1 | 10/2002 |
| KR | 1020020033373 | 5/2002 |
| KR | 1020020043116 | 6/2002 |

* cited by examiner

*Primary Examiner*—Kenneth Parker
*Assistant Examiner*—José R. Diaz
(74) *Attorney, Agent, or Firm*—H.C. Park & Associates, PLC

(57) ABSTRACT

A thin film transistor formed by using a Metal Induced Lateral Crystallization process and method for fabricating the same. The thin film transistor comprises an active layer having source/drain regions and a channel region, a gate electrode, an insulating layer having contact holes for exposing a portion of each of the source/drain regions, and a crystallization inducing pattern exposing a portion of the active layer. The source/drain electrodes are coupled to the source/drain regions through the contact holes, and the crystallization inducing pattern does not couple the source/drain regions to the source/drain electrodes.

20 Claims, 10 Drawing Sheets

THIN FILM TRANSISTOR AND METHOD FOR FABRICATING THE SAME

CROSS-REFERENCE TO RELATED APPLICATION

This application claims the benefit of and priority to Korean Patent Application No. 10-2003-0083381, filed Nov. 22, 2003, which is hereby incorporated by reference for all purposes as if fully set forth herein.

BACKGROUND OF THE INVENTION

1. Field of the Invention

The present invention relates to a thin film transistor (TFT) and method for fabricating the same and, more particularly, to a TFT formed by a Metal Induced Lateral Crystallization (MILC) process and method for fabricating the same.

2. Discussion of the Related Art

A method for forming a polycrystalline silicon layer, which may be used for the TFT's active layer, comprises depositing an amorphous silicon layer on an insulating substrate, and then crystallizing the amorphous silicon layer at a predetermined temperature.

Solid Phase Crystallization (SPC), Eximer Laser Annealing (ELA), Metal Induced Lateral Crystallization (MILC), and other similar methods may be employed to crystallize the amorphous silicon layer.

However, the SPC method takes a long time, and it requires a high temperature for the crystallization. The ELA method requires expensive equipment, and the laser may cause unevenness and striped defects.

However, the MILC method requires a relatively low processing temperature and a short time for the process, and conventional thermal treatment equipment may be used.

FIG. 1 is a plan view showing an active layer and a gate electrode of a conventional TFT.

The TFT shown in FIG. 1 comprises an active layer 110 crystallized by the MILC process and having source/drain regions S and D, a gate electrode 120, and contact holes 130 for exposing portions of the source/drain regions S and D.

FIG. 2A, FIG. 2B, FIG. 2C, and FIG. 2D are cross-sectional views showing a method for fabricating a conventional TFT, which are taken along the line I–I' of FIG. 1.

Referring to FIG. 2A, amorphous silicon is deposited on an insulating substrate 200 having a buffer layer 210 and patterned to form an amorphous silicon active layer 220.

After the forming the active layer 220, a gate insulating layer 230 and a gate electrode material are sequentially formed on the substrate, and the gate electrode material is then patterned to form a gate electrode 240.

Next, impurities are implanted using the gate electrode 240 as a mask to form source/drain regions 221 and 225 in the active layer 220. A region between the source/drain regions 221 and 225 acts as a channel region 223.

Referring to FIG. 2B, an interlayer insulating layer 250 is deposited on the substrate having the gate electrode 240, and contact holes 251 and 255 are then formed to expose portions of the source/drain regions 221 and 225.

A crystallization inducing metal layer 260, such as nickel (Ni), is then deposited on the substrate by means of sputtering or other similar methods.

Referring to FIG. 2C, the crystallization inducing metal layer 260 is heat treated in a furnace to crystallize the amorphous silicon active layer 220 into a polycrystalline silicon layer.

Amorphous silicon regions 221a and 225a, located below the crystallization inducing metal layer 260 and within the contact holes 251 and 255, are crystallized by a metal induced crystallization (MIC) process, and the remaining amorphous silicon regions 221b and 225b are crystallized by the MILC process.

Referring to FIG. 2D, the crystallization inducing metal layer 260 is removed, and a conductive layer is deposited and patterned to form source/drain electrode 271 and 275, thus forming the TFT.

In the TFT fabricated by the above-mentioned process, contact holes may have different sizes to lack of etch uniformity of HF, which may be used for a general etchant during the process of forming the contact holes 251 and 255. Additionally, a contact hole exposes a small portion of the active layer as compared to the total width of the active layer.

The small and irregular contact hole size may cause a lack of uniformity of crystallization speed and a lowered crystallization speed while performing the MILC process. Consequently, the TFT's characteristics may not be constant.

SUMMARY OF THE INVENTION

The present invention provides a TFT having a separate crystallization inducing pattern for the MILC and method for fabricating the same.

Additional features of the invention will be set forth in the description which follows, and in part will be apparent from the description, or may be learned by practice of the invention.

The present invention discloses a thin film transistor comprising an active layer having source/drain regions and a channel region, and a gate electrode. An insulating layer has contact holes exposing a portion of each of the source/drain regions and a crystallization inducing pattern exposing a portion of the active layer. Source/drain electrodes are coupled to the source/drain regions through respective contact holes, and the crystallization inducing pattern does not couple the source/drain regions to the source/drain electrodes.

The present invention also discloses a thin film transistor comprising an active layer having source/drain regions and a channel region, and a gate electrode is formed on a gate insulating layer. An insulating layer has contact holes exposing a portion of each of the source/drain regions, and a crystallization inducing pattern exposes a portion of the active layer. Source/drain electrodes are coupled to the source/drain regions through respective contact holes, and a protection layer is formed within the crystallization inducing pattern. The crystallization inducing pattern and the protection layer do not couple the source/drain regions to the source/drain electrodes.

The present invention also discloses a method for fabricating a thin film transistor comprising forming an active layer with amorphous silicon on an insulating substrate, forming a gate electrode on a gate insulating layer, and forming source/drain regions and a channel region. An insulating layer is formed having contact holes exposing a portion of each of the source/drain regions and a crystallization inducing pattern exposing a portion of the active layer. A crystallization inducing layer is deposited on the entire surface of the insulating substrate and the active layer is crystallized. Source/drain electrodes are formed and coupled to the source/drain regions through the contact holes, and the crystallization inducing pattern does not couple the source/drain regions to the source/drain electrodes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Figure 1:
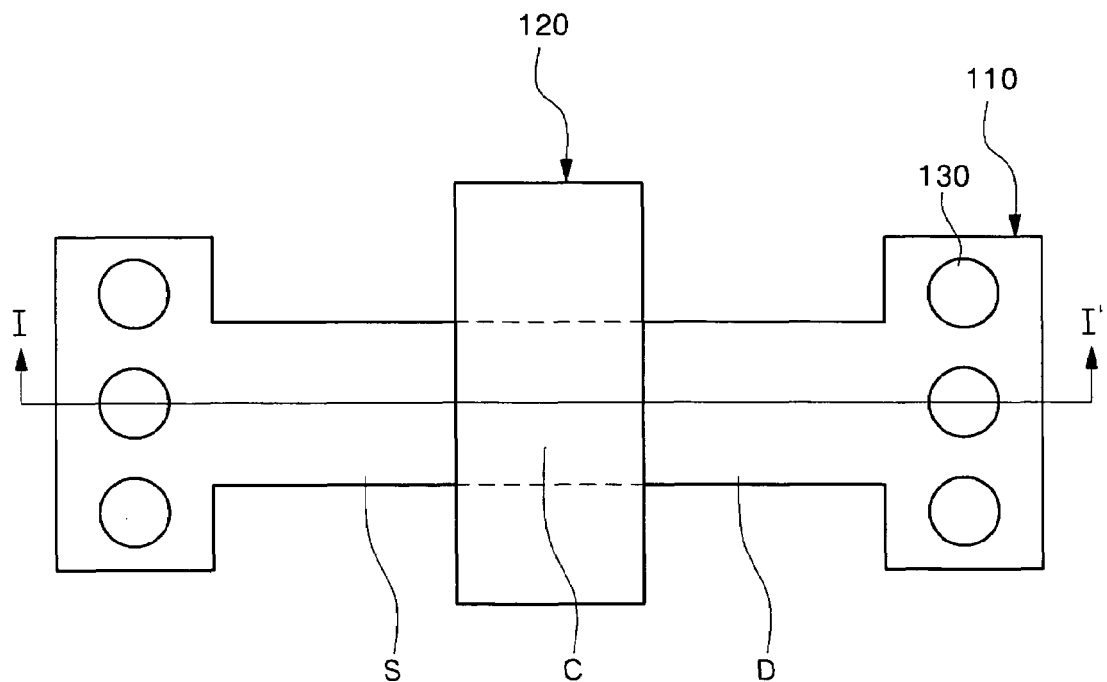
FIG. 1 is a plan view showing an active layer and a gate electrode of a conventional TFT.
Figure 2A:
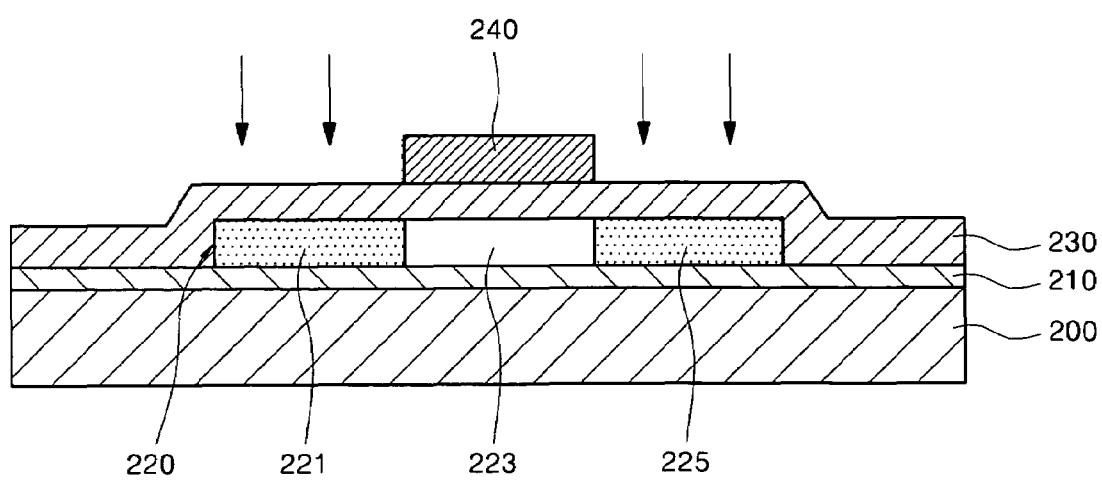
FIG. 2A, FIG. 2B, FIG. 2C and FIG. 2D are cross-sectional views taken along the line I–I' of FIG. 1 showing a method for fabricating a conventional TFT.
Figure 2B:
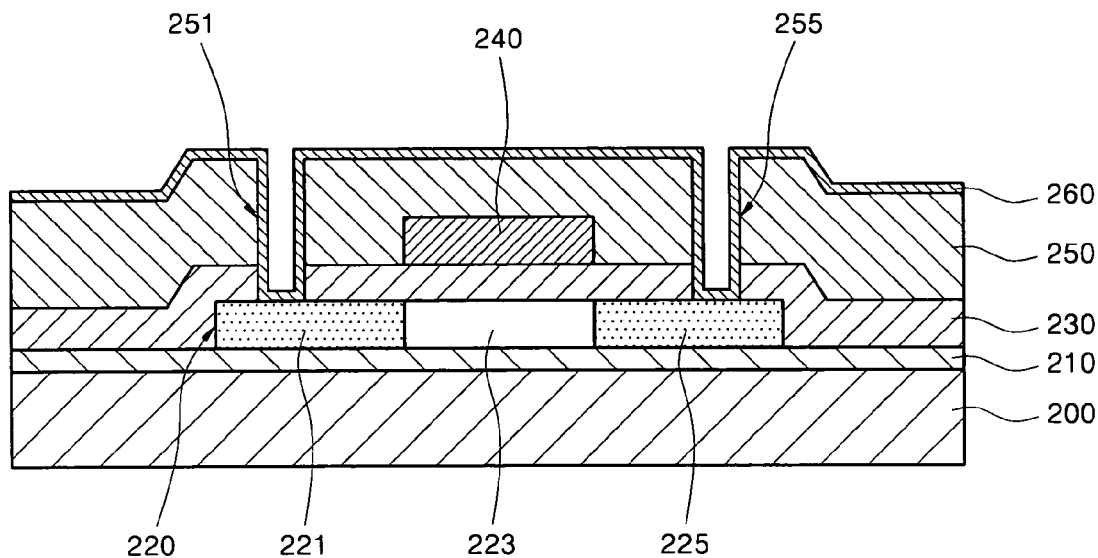
Figure 2C:
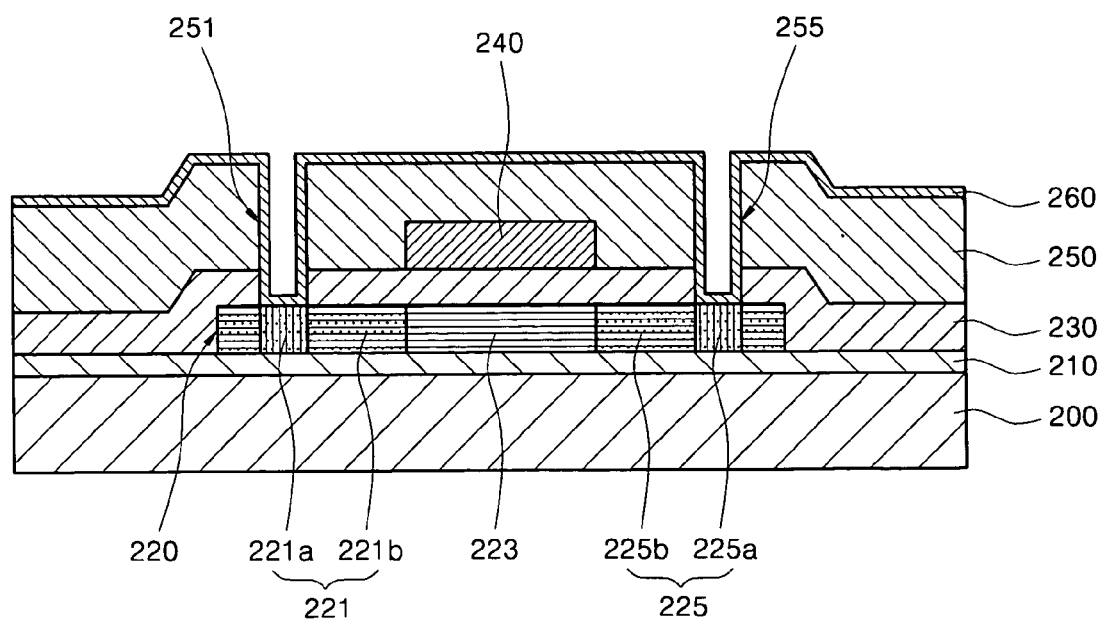
Figure 2D:
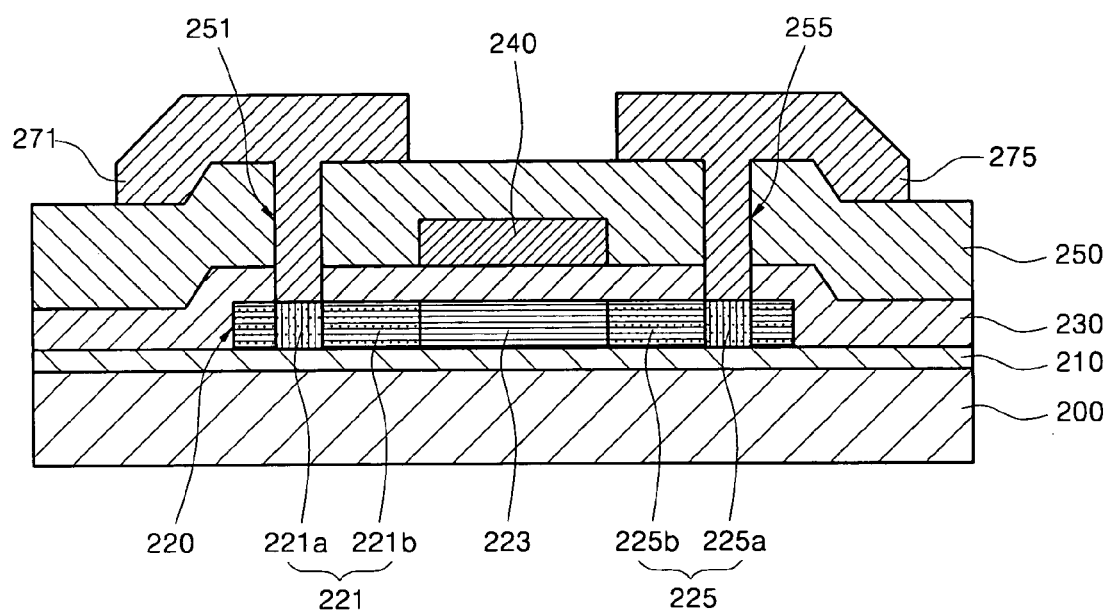

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

First embodiment

FIG. 3A, FIG. 3B, FIG. 3C, FIG. 3D and FIG. 3E are cross-sectional views showing a method for fabricating a TFT formed by using an MILC process in accordance with a first exemplary embodiment of the present invention.

The TFT of the first exemplary embodiment of the present invention comprises an active layer 320 having source/drain regions 321 and 325 and a channel region 323, a gate electrode 340 formed on a gate insulating layer 330, an interlayer insulating layer 350 having contact holes 351 and 355 for exposing a portion of the source/drain regions 321 and 325, respectively, at least one crystallization inducing pattern 357, and source/drain electrodes 371 and 375, which are coupled to the source/drain regions 321 and 325 through the contact holes 351 and 355. The crystallization inducing pattern 357 does not couple the source/drain regions 321 and 325 to the source/drain electrodes 371 and 375.

Figure 3A:
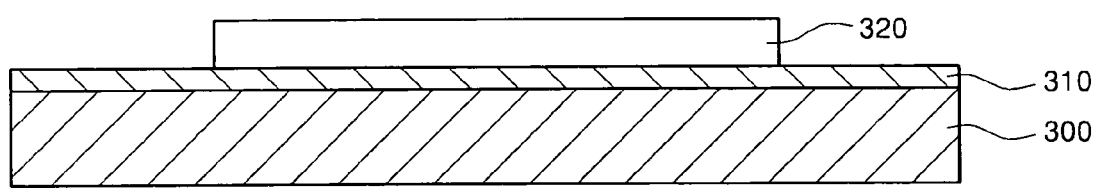
FIG. 3A, FIG. 3B, FIG. 3C, FIG. 3D and FIG. 3E are cross-sectional views showing a TFT fabricating method using an MILC process in accordance with a first exemplary embodiment of the present invention.

Referring to FIG. 3A, a buffer layer 310, which is a diffusion barrier, prevents impurities, such as metal ions from the insulating substrate 300, from diffusing and penetrating the subsequently formed polycrystalline silicon active layer.

Amorphous silicon is then deposited on the buffer layer 310 and patterned to form the amorphous silicon active layer 320.

Figure 3B:
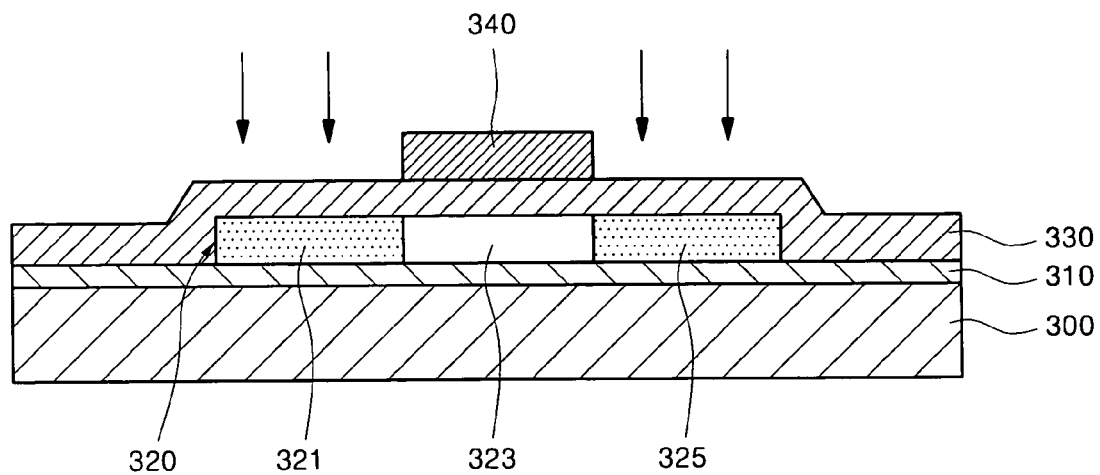

Referring to FIG. 3B, a gate insulating layer 330 and a gate electrode material are sequentially formed on the entire surface of the substrate, and the gate electrode material is patterned to form the gate electrode 340.

After forming the gate electrode 340, impurities are implanted using it as a mask to form the source/drain regions 321 and 325 in the active layer 320. A region in the active layer 320 between the source/drain regions 321 and 325 acts as a channel region 323.

Figure 3C:
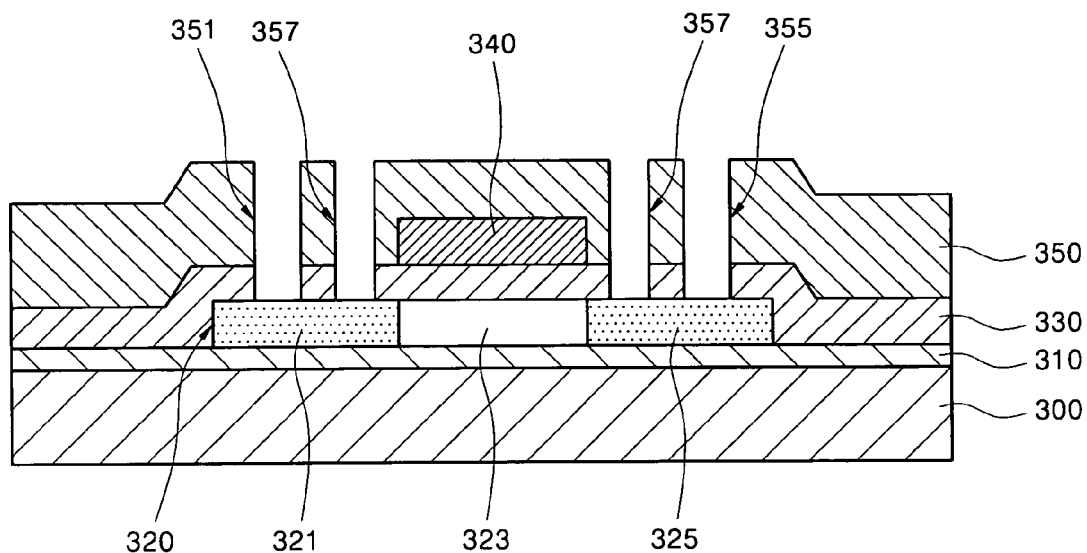

Referring to FIG. 3C, an interlayer insulating layer 350 is deposited on the substrate and patterned to form contact holes 351 and 355, which expose a portion of the source/drain regions 321 and 325.

Crystallization inducing patterns 357, which are patterns for depositing a crystallization inducing metal, are formed when the contact holes 351 and 355 are formed.

The crystallization inducing patterns 357 may be formed between the channel region 323 and each of the contact holes 351 and 355.

In other words, a distance from the crystallization inducing pattern 357 to the channel region 323 is preferably shorter than a distance from the contact holes 351 and 355 to the channel region 323.

Additionally, the width of the portion of the active layer 320 that is exposed by the crystallization inducing pattern 357 is preferably wider than the width of the portion of the active layer 320 that is exposed by a contact hole. More preferably, the width of the portion of the active layer 320 that is exposed by the crystallization inducing pattern 357 has the same width as that of the channel region 323. A wide width is desirable for the portion of the active layer 320 exposed by the crystallization inducing pattern 357 because as that width increases, the uniformity of the MILC may increase.

Figure 3D:
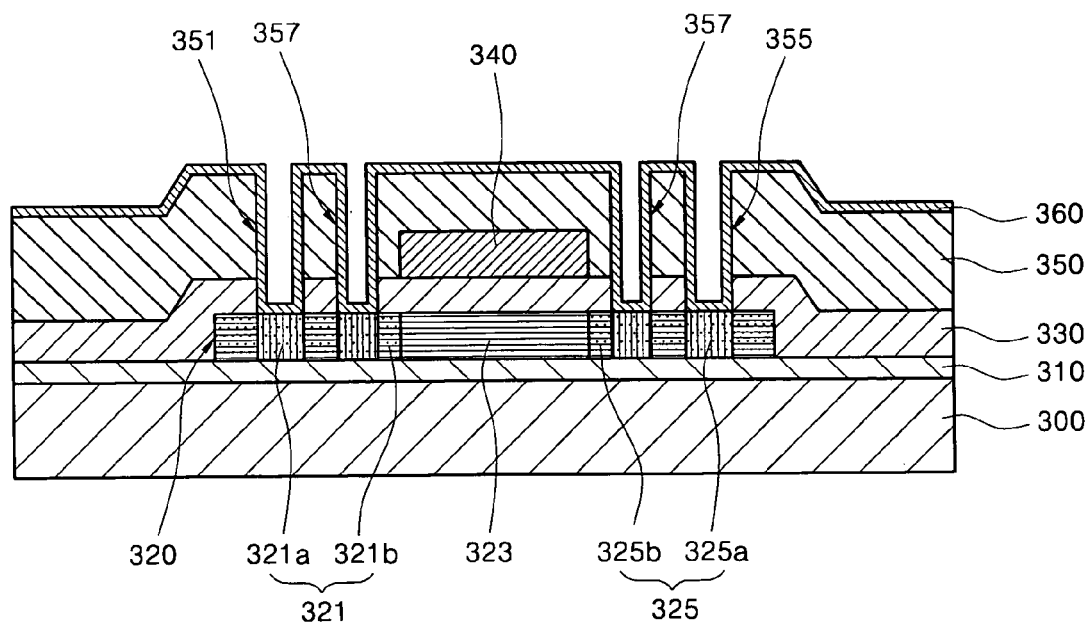

Referring to FIG. 3D, after forming the contact holes 351 and 355 and the crystallization inducing patterns 357, a crystallization inducing metal layer 360, such as Ni, is deposited on the substrate.

The crystallization inducing metal layer 360 reacts with the amorphous silicon active layer 320 to form silicide, but it does not react with the interlayer insulating layer 350.

Furthermore, the crystallization inducing metal layer 360 is preferably deposited at a thickness of 50 Å or more so that it may be uniformly applied onto the crystallization inducing pattern 357. More preferably, it may be deposited at a thickness of 200 Å or more, which may prevent a lack of uniformity for the MILC due to the non-uniform deposition of the crystallization inducing metal layer 360.

After depositing the crystallization inducing metal layer 360, it is heat treated in a furnace to crystallize the amorphous silicon of the active layer 320 into polycrystalline silicon.

Lower regions 321a and 325a correspond to portions of the active layer 320, exposed by the crystallization inducing patterns 357 and the contact holes 351 and 355, and on which the crystallization inducing metal layer 360 is deposited. During crystallization, the lower regions 321a and 325a are crystallized by the MIC process, and the remaining regions 321b and 325b of the active layer 320 are crystallized by the MILC process.

Figure 3E:
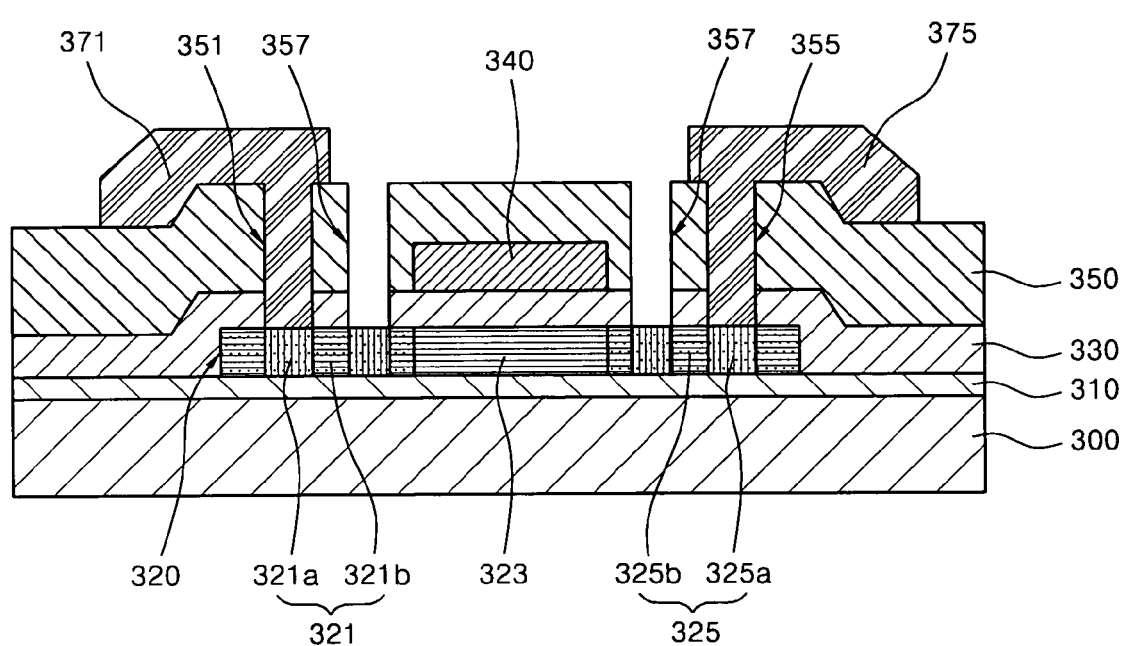

Referring to FIG. 3E, a residual crystallization inducing metal layer 360 is removed, and a conductive material is deposited on the substrate and patterned to form source/drain electrodes 371 and 375, thus forming the TFT for flat panel display. The conductive material that is deposited within the crystallization inducing patterns 357 may be removed by etching.

The source/drain electrodes 371 and 375 are coupled to the source/drain regions 321 and 325 of the active layer 320 through contact holes 351 and 355, but they are not coupled to the source/drain regions 321 and 325 through the crystallization inducing patterns 357.

While the drawings do not show the subsequent process, a general method for fabricating the flat panel display may be performed.

In the TFT fabricated as described above, the crystallization inducing patterns 357 may prevent the lowered growth speed and lack of uniformity of the MILC speed. As a result, the channel region 323 of the active layer 320 may be effectively crystallized, and the crystallization uniformity of the channel region 323 may also be improved.

Second embodiment

Figure 4:
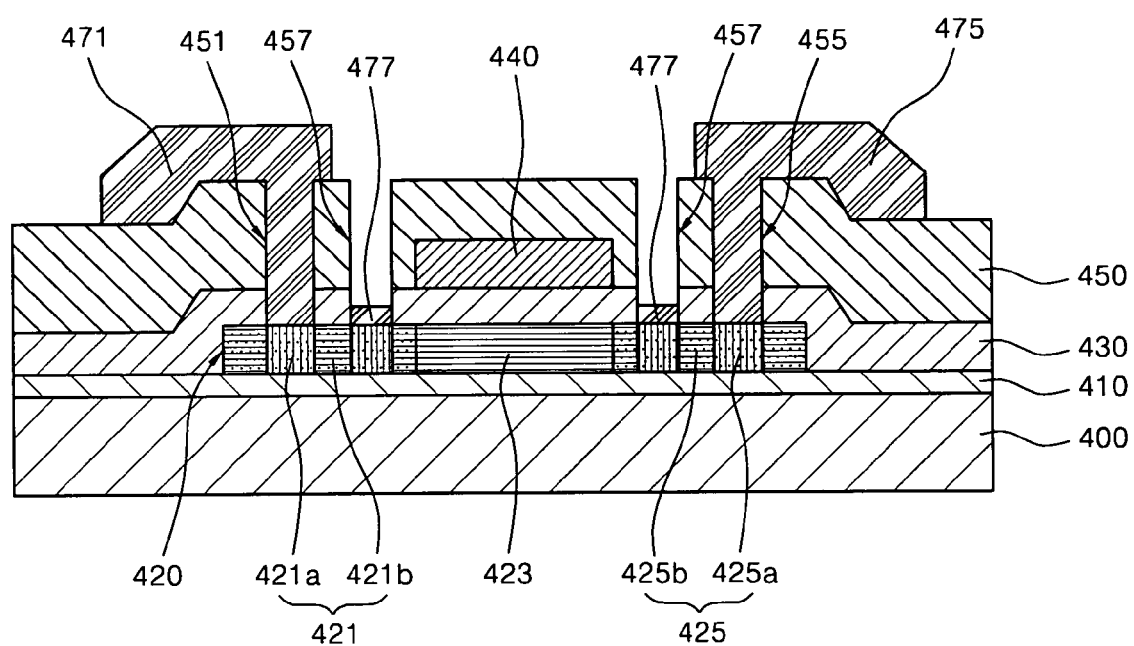
FIG. 4 is a cross-sectional view showing a TFT fabricating method using an MILC process in accordance with a second exemplary embodiment of the present invention.
Figure 5A:
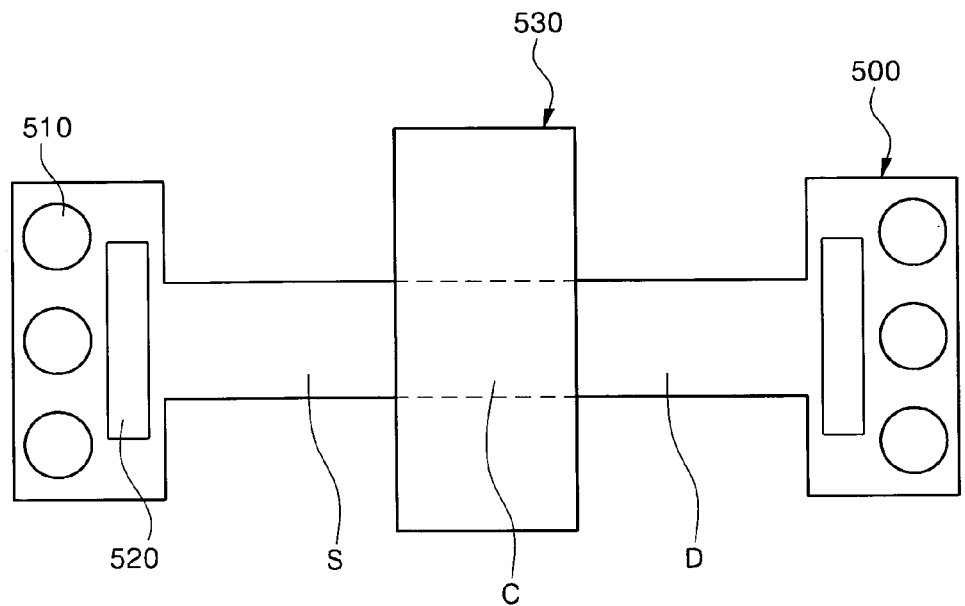
FIG. 5A, FIG. 5B, FIG. 5C, FIG. 5D and FIG. 5E are plan views showing an active layer and a gate electrode of a TFT with a crystallization induced pattern in accordance with an exemplary embodiment of the present invention.
Figure 5B:
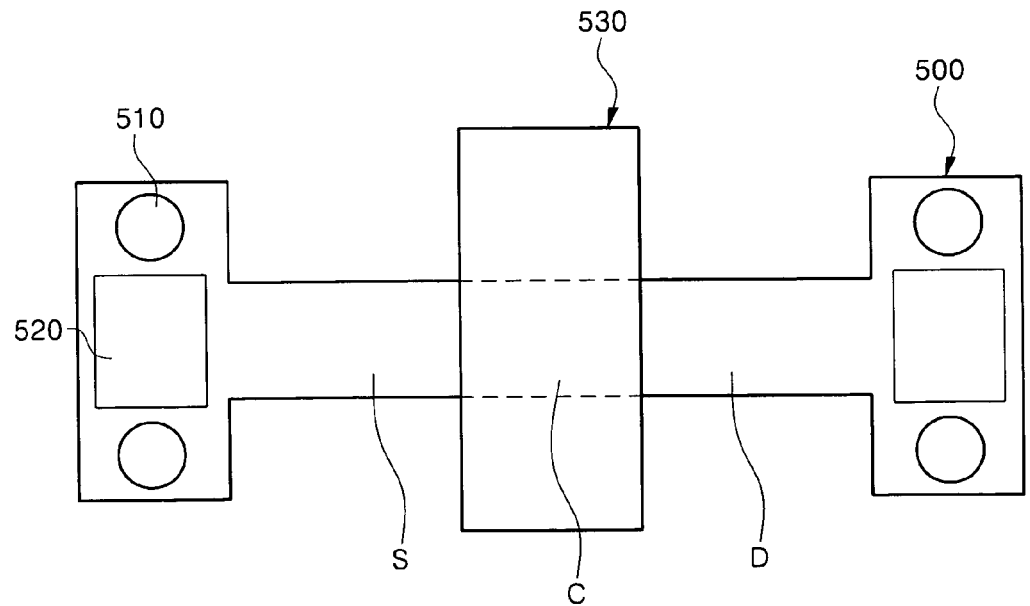
Figure 5C:
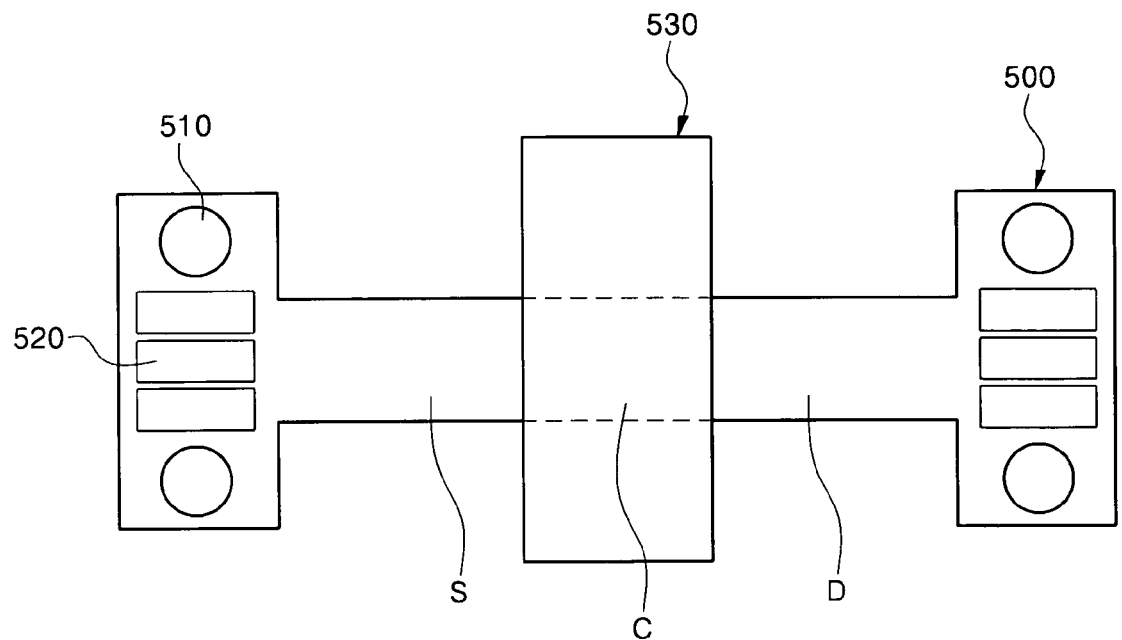
Figure 5D:
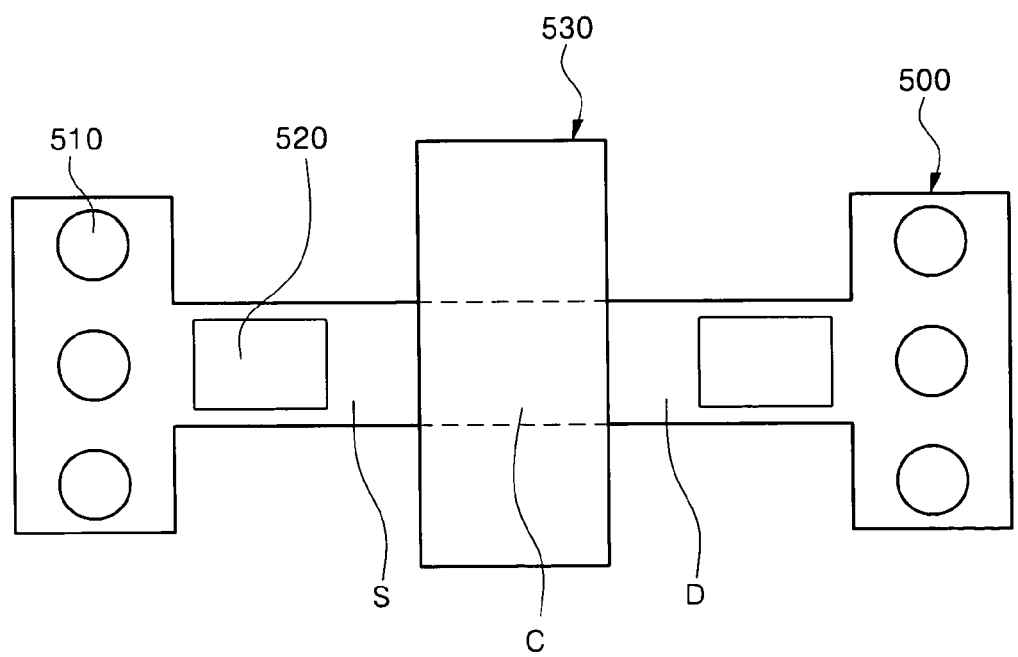
Figure 5E:
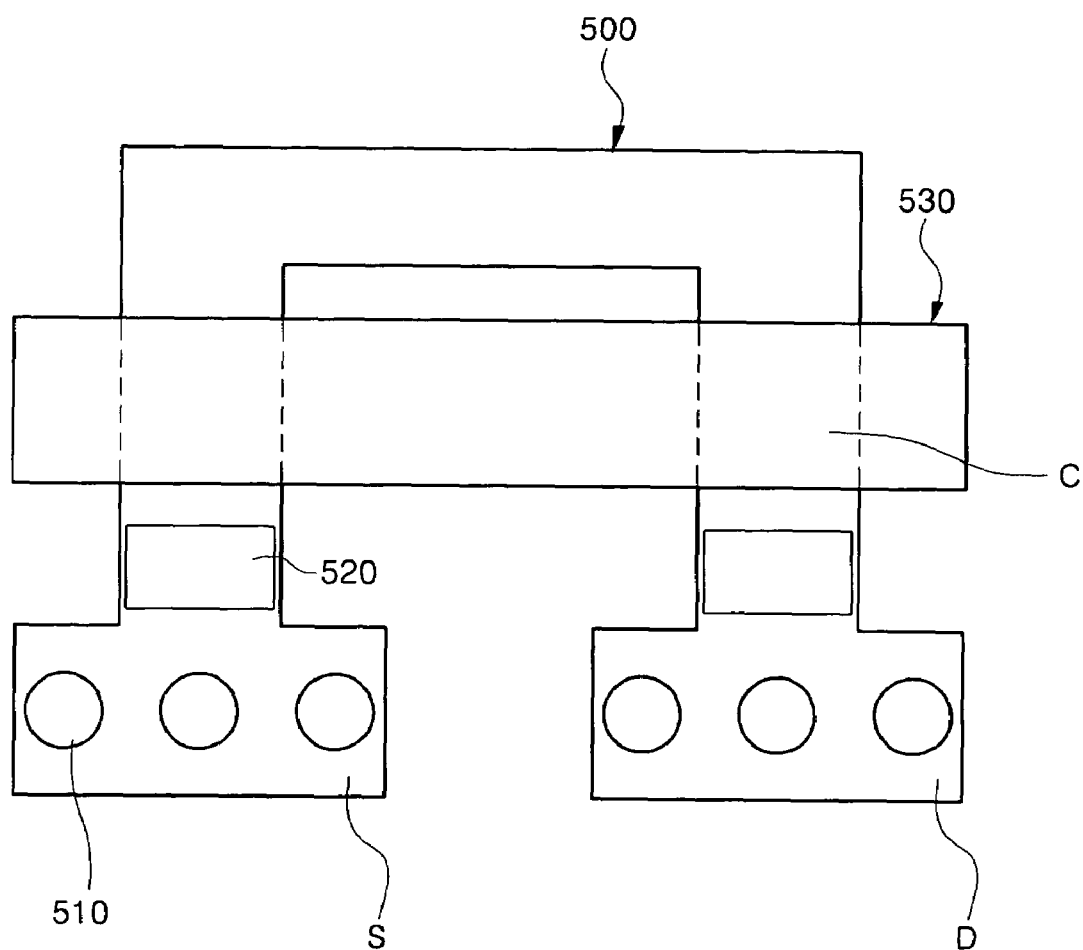

FIG. 4 is a cross-sectional view showing a method for fabricating a TFT formed by using an MILC process in accordance with a second exemplary embodiment of the present invention.

The TFT according to the second exemplary embodiment of the present invention has a similar structure to the TFT of the first exemplary embodiment. However, it differs from the first exemplary embodiment in that conductive material used to form the source/drain electrodes 471 and 475 is left within the crystallization inducing patterns 457.

Like in the first exemplary embodiment, an active layer 420 having source/drain regions 421 and 425 and a channel region 423, a gate electrode 440, and an interlayer insulating layer 450 having crystallization inducing patterns 457 and contact holes 451 and 455 are formed. The active layer 420 is crystallized into polycrystalline silicon by means of the MIC and MILC processes, and a conductive material is deposited on the substrate and patterned to form. the source/drain electrodes 471 and 475. Unlike the first exemplary embodiment, however, the conductive material within the crystallization inducing pattern 457 is not removed by bulk-etching. Consequently, those remaining portions of the conductive material form a passivation metal layer 477.

Leaving the passivation metal layer 477 in place, instead of removing it, may prevent damage to the area it is deposited on because it is not removed by the bulk-etching. In other words, the conductive material is used to form the passivation metal layer 477 in order to prevent the bulk-etching from damaging the active layer 320.

Additionally, the passivation metal layer 477 preferably does not couple the source/drain regions 421 and 425 to the source/drain electrodes 471 and 475, as is the case with the crystallization inducing pattern 457.

While not shown in the drawings, a general method may be used to subsequently fabricate the flat panel display.

FIG. 5A, FIG. 5B, FIG. 5C, FIG. 5D and FIG. 5E are plan views showing an active layer and a gate electrode of a TFT with a crystallization inducing pattern in accordance with an exemplary embodiment of the present invention.

Referring to FIG. 5A, FIG. 5B, FIG. 5C, FIG. 5D and FIG. 5E, a crystallization inducing pattern 520 may have various shapes and locations. It may be formed between the channel region C, which is located below the gate electrode 530, and a contact hole 510, which exposes portions of source/drain regions S and D of an active layer 500.

A distance from the crystallization inducing pattern 520 to the channel region C is preferably shorter than a distance from the contact hole 510 to the channel region C.

The width of the portion of the active layer 500 that is exposed by the crystallization inducing pattern 520 is preferably wider than the width of the portion of the active layer 500 that is exposed by one contact hole 510. More preferably, the width of the portion of the active layer 500 exposed by the crystallization inducing pattern 520 is the same as the width of the portion of the active layer 500 that is exposed by the channel region C.

Additionally, at least one crystallization inducing pattern 520 is preferably formed in each of the source/drain regions S and D.

In accordance with exemplary embodiments of the present invention as described above, the crystallization inducing metal layer is deposited in separately formed crystallization inducing patterns to perform the MILC process, which may prevent the lack of uniformity of the MILC speed and lowered growth speed.

Consequently, a TFT having uniform characteristics and method for fabricating the same may be obtained.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A thin film transistor (TFT), comprising:
an active layer having a source region, a drain region, and a channel region;
a gate electrode;
an insulating layer having a first contact hole exposing a portion of the source region, a second contact hole exposing a portion of the drain region, and a crystallization inducing pattern exposing a portion of the active layer; and
a source electrode coupled to the source region through the first contact hole, and a drain electrode coupled to the drain region through the second contact hole,
wherein the crystallization inducing pattern does not couple the source region to the source electrode or the drain region to the drain electrode.

2. The TFT of claim 1, wherein the crystallization inducing pattern is formed between the channel region and a contact hole.

3. The TFT of claim 1, wherein a width of the portion of the active layer exposed by the crystallization inducing pattern is larger than a width of a portion of the active layer exposed by a contact hole.

4. The TFT of claim 3, wherein the width of the portion of the active layer exposed by the crystallization inducing pattern is the same as a width of the channel region.

5. A thin film transistor (TFT), comprising:
an active layer having a source region, a drain region, and a channel region;
a gate electrode;
an insulating layer having a first contact hole exposing a portion of the source region, a second contact hole exposing a portion of the drain region, and a crystallization inducing pattern exposing a portion of the active layer;

a source electrode coupled to the source region through the first contact hole, and a drain electrode coupled to the drain region through the second contact hole; and a protection layer formed on the portion of the active layer exposed by the crystallization inducing pattern, wherein the crystallization inducing pattern and the protection layer do not couple the source region to the source electrode or the drain region to the drain electrode.

6. The TFT of claim 5, wherein the crystallization inducing pattern is formed between a contact hole and the channel region.

7. The TFT of claim 5, wherein a width of the portion of the active layer exposed by the crystallization inducing pattern is larger than a width of a portion of the active layer exposed by a contact hole.

8. The TFT of claim 7, wherein the width of the portion of the active layer exposed by the crystallization inducing pattern is the same as a width of the channel region.

9. The TFT of claim 7, wherein the protection layer is a metal layer.

10. The TFT of claim 7, wherein the protection layer is made of a same material as the source electrode and the drain electrode.

11. A method for fabricating a thin film transistor, comprising:

forming an active layer of amorphous silicon on an insulating substrate;

forming a gate electrode on a gate insulating layer;

forming a source region, a drain region, and a channel region in the active layer;

forming a first contact hole exposing a portion of the source region, a second contact hole exposing a portion of the drain region, and a crystallization inducing pattern exposing a portion of the active layer;

depositing a crystallization inducing layer on an entire surface of the insulating substrate;

crystallizing the active layer; and forming a source electrode coupled the source region by the first contact hole, and a drain electrode coupled to the drain region by the second contact hole, wherein the crystallization inducing pattern does not couple the source region to the source electrode or the drain region to the drain electrode.

12. The method of claim 11, wherein the crystallization inducing layer has a thickness of 50 Å or more.

13. The method of claim 12, wherein the crystallization inducing layer has a thickness of 200 Å or more.

14. The method of claim 11, wherein the crystallization inducing layer is a metal layer; and wherein the active layer is crystallized by a metal induced lateral crystallization process.

15. The method of claim 14, wherein the metal layer is made of Ni.

16. The method of claim 11, wherein the crystallization inducing pattern is formed between a contact hole and the channel region.

17. The method of claim 11, wherein a width of the portion of the active layer exposed by the crystallization inducing pattern is larger than a width of a portion of the active layer exposed by a contact hole.

18. The method of claim 17, wherein the width of the portion of the active layer exposed by the crystallization inducing pattern is the same as a width of the channel region.

19. The method of claim 11, further comprising:

forming a protection layer on the portion of the active layer exposed by the crystallization inducing pattern, wherein the protection layer does not couple the source region to the source electrode or the drain region to the drain electrode.

20. The method of claim 19, wherein the protection layer is a passivation metal layer made of a same material as the source electrode and the drain electrode.

* * * * *